(12) United States Patent  
Zuo et al.

(10) Patent No.: US 9,130,505 B2
(45) Date of Patent: Sep. 8, 2015

(54) MULTI-FREQUENCY RECONFIGURABLE VOLTAGE CONTROLLED OSCILLATOR (VCO) AND METHOD OF PROVIDING SAME

(75) Inventors: Chengjie Zuo, San Diego, CA (US); Changhan Yun, San Diego, CA (US); Chi Shun Lo, San Diego, CA (US); Jonghae Kim, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 96 days.

(21) Appl. No.: 13/293,361

(22) Filed: Nov. 10, 2011

(65) Prior Publication Data

US 2013/0120074 A1    May 16, 2013

(51) Int. Cl.
*H03B 5/30* (2006.01)
*H03B 5/12* (2006.01)
*H03B 5/36* (2006.01)

(52) U.S. Cl.
CPC ............ *H03B 5/1243* (2013.01); *H03B 5/1262* (2013.01); *H03B 5/30* (2013.01); *H03B 5/368* (2013.01); *H03B 2200/0048* (2013.01); *H03B 2201/0208* (2013.01); *Y10T 29/49117* (2015.01)

(58) Field of Classification Search
CPC .......................... H03B 5/30; H03B 2201/0208
USPC ............ 331/158, 116 R, 116 FE, 167, 117 R, 331/117 FE, 177 V, 154, 116 M
See application file for complete search history.

(56) References Cited

U.S. PATENT DOCUMENTS

| 3,525,875 | A  | * | 8/1970  | Ziomek .................... 307/10.1 |
| 4,661,785 | A  | * | 4/1987  | Benjaminson ................ 331/109 |
| 5,942,950 | A  |   | 8/1999  | Merenda |
| 7,154,349 | B2 |   | 12/2006 | Cabanillas |
| 7,221,920 | B2 | * | 5/2007  | Abe et al. .................... 455/255 |
| 7,365,612 | B2 |   | 4/2008  | Rohde et al. |
| 2003/0025567 | A1 | * | 2/2003 | Kubo et al. ................... 331/158 |
| 2007/0296513 | A1 | * | 12/2007 | Ruile et al. ................ 331/116 R |
| 2011/0018649 | A1 |   | 1/2011 | David et al. |

FOREIGN PATENT DOCUMENTS

GB  2477143 A  7/2011
JP  S62272703 A  11/1987
(Continued)

OTHER PUBLICATIONS

Kao, H.L., et al. "Switched resonators using adjustable inductors in 2.4/5 GHz dual-band LC VCO." Electronics Letters Issue Date: Feb. 14, 2008 vol. 44 Issue: 4 on pp. 299-300 ISSN: 0013-5194.
(Continued)

*Primary Examiner* — Arnold Kinkead
(74) *Attorney, Agent, or Firm* — Donald D. Min

(57) ABSTRACT

A multiple frequency reconfigurable voltage controlled oscillator (VCO) (136) includes a variable capacitance device (112), an inductor (116) coupled in parallel with the variable capacitance device (112), and at least two circuit paths (118, 120, 122) coupled in parallel with the variable capacitance device (112) and the inductor (116). The circuit paths (118, 120, 122) each include a piezoelectric laterally vibrating resonator (126, 130, 134) and a switch (124, 128, 132) for selectably coupling each piezoelectric laterally vibrating resonator (126, 130, 134) in parallel with the inductor (116) and variable capacitance device (112).

32 Claims, 3 Drawing Sheets

(56) References Cited

FOREIGN PATENT DOCUMENTS

| JP | 2006203304 A | 8/2006 |
|----|--------------|--------|
| JP | 2008502240 A | 1/2008 |
| JP | 2011135139 A | 7/2011 |

OTHER PUBLICATIONS

Zuo, C. et al. "1.05 GHz MEMS Oscillator Based on Lateral-Field-Excited Piezoelectric AlN Resonators," 2009 Joint Meeting of the European Frequency and Time Forum and the IEEE International Frequency Control Symposium (EFTF-IFCS 2009) (2009) 381:384.

Nguyen, C.T.C, "RF MEMS in Wireless Architecture (invited)," Proceedings, the 42nd Design Automation Conference, Anaheim, California, Jun. 13-17, 2005, pp. 416-420.

Zuo, C. et al."1.05-GHz CMOS Oscillator Based on Lateral-Field-Excited Piezoelectric AlN Contour-Mode MEMS Resonators" IEEE Transactions on Ultrasonics, Ferroelectrics, and Frequency Control 57.1 (2010): 82-87.

Helle J., "VCXO Theory and Practice,"29th Annual Symposium on Frequency Control, 1975, pp. 300-307.

International Search Report and Written Opinion—PCT/US2012/064714—ISA/EPO—Aug. 27, 2013.

\* cited by examiner

MULTI-FREQUENCY RECONFIGURABLE VOLTAGE CONTROLLED OSCILLATOR (VCO) AND METHOD OF PROVIDING SAME

FIELD OF DISCLOSURE

The present application is directed to a multi-frequency reconfigurable voltage controlled oscillator (VCO) and a method of providing same, and, more specifically, to a multi-frequency reconfigurable VCO having an inductor coupled in parallel with a plurality of resonators and to a method of providing same.

BACKGROUND

A voltage controlled oscillator (VCO) is an oscillating circuit that produces an output having a frequency that can be controlled by a DC voltage input to the VCO. VCO's are commonly used in phase-locked loops in communications equipment including but not limited to wireless devices such as cellular telephones. Conventionally, VCO's have been implemented with on-chip inductors and capacitors (LC) or with piezoelectric micro-electro-mechanical systems (MEMS) resonators, including film bulk acoustic resonators (FBAR's) and aluminum nitride (AlN) contour mode resonators (CMR's).

On-chip LC VCO's have a wide tuning range, greater than 10%, for example. Because on-chip inductors generally have a low Q-factor (generally <30), such VCO's are generally characterized by high phase noise. This may be disadvantageous in certain environments where low phase noise and/or small size are desirable. MEMS-based VCO's, on the other hand, may be significantly smaller due to the small form factor of MEMS resonators. Furthermore, the high Q-factor (>1000) of these resonators results in a VCO that exhibits low phase noise. However, due to the low electromechanical coupling of these mechanical resonators, MEMS VCO's generally have a small tuning range, less than 3%, for example. This limited tuning range makes it difficult to cover large portions of a signal band without using a prohibitively large number of resonators.

It would therefore be desirable to provide a VCO that could be configured to cover a relatively large frequency range, the 100 MHz to 3 GHz range of cellular frequencies, for example, that is also compact in size with a small number of resonators and that exhibits low phase noise.

SUMMARY

An exemplary embodiment comprises a multiple frequency reconfigurable voltage controlled oscillator (VCO) having at least one resonator, at least one inductor arranged in parallel with the at least one resonator, and a variable capacitance device coupled in parallel to the inductor and arranged in parallel to the at least one resonator. The at least one resonator is selectably coupled in parallel with the inductor and the variable capacitance device.

Another embodiment comprises a method of providing a multiple frequency reconfigurable VCO that includes coupling an inductor in parallel with a variable capacitance device, providing a plurality of circuit paths in parallel with the inductor, providing a resonator and a switch in each of the plurality of circuit paths, and closing the switch in at least one of the plurality of circuit paths to produce an oscillating signal.

A further embodiment includes a multiple frequency reconfigurable VCO having a variable capacitance device, an inductor coupled in parallel with the variable capacitance device, and at least two circuit paths coupled in parallel with the variable capacitance device and the inductor. The at least two circuit paths each include a piezoelectric laterally vibrating resonator and a switch for selectably coupling the piezoelectric laterally vibrating resonator in parallel with the inductor and the variable capacitance device.

Yet another embodiment includes a multiple frequency reconfigurable VCO that includes a resonator arrangement, an inductor arrangement in parallel with the resonator arrangement and a variable capacitance arrangement coupled in parallel to the inductor arrangement and in parallel to the resonator arrangement. The oscillator also includes a switch arrangement for selectably coupling the resonator arrangement in parallel with the inductor arrangement.

Another embodiment include a method of providing a multiple frequency reconfigurable VCO that includes step for coupling an inductor in parallel with a variable capacitance device, step for providing a plurality of circuit paths in parallel with the inductor, step for providing a resonator and a switch in each of the plurality of circuit paths, and step for closing the switch in at least one of the plurality of circuit paths to produce an oscillating signal.

BRIEF DESCRIPTION OF THE DRAWINGS

The accompanying drawings are presented to aid in the description of embodiments of the invention and are provided solely for illustration of the embodiments and not limitation thereof.

DETAILED DESCRIPTION

Aspects of the invention are disclosed in the following description and related drawings directed to specific embodiments of the invention. Alternate embodiments may be devised without departing from the scope of the invention. Additionally, well-known elements of the invention will not be described in detail or will be omitted so as not to obscure the relevant details of the invention.

The word "exemplary" is used herein to mean "serving as an example, instance, or illustration." Any embodiment described herein as "exemplary" is not necessarily to be construed as preferred or advantageous over other embodiments. Likewise, the term "embodiments of the invention" does not require that all embodiments of the invention include the discussed feature, advantage or mode of operation.

The terminology used herein is for the purpose of describing particular embodiments only and is not intended to be limiting of embodiments of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Further, embodiments may be described in terms of sequences of actions to be performed by, for example, elements of a computing device. It will be recognized that various actions described herein can be performed by specific circuits (e.g., application specific integrated circuits (ASICs)), by program instructions being executed by one or more processors, or by a combination of both. Additionally, these sequence of actions described herein can be considered to be embodied entirely within any form of computer readable storage medium having stored therein a corresponding set of computer instructions that upon execution would cause an associated processor to perform the functionality described herein. Thus, the various aspects of the invention may be embodied in a number of different forms, all of which have been contemplated to be within the scope of the claimed subject matter. In addition, for each of the embodiments described herein, the corresponding form of any such embodiments may be described herein as, for example, "logic configured to" perform the described action.

Figure 1:
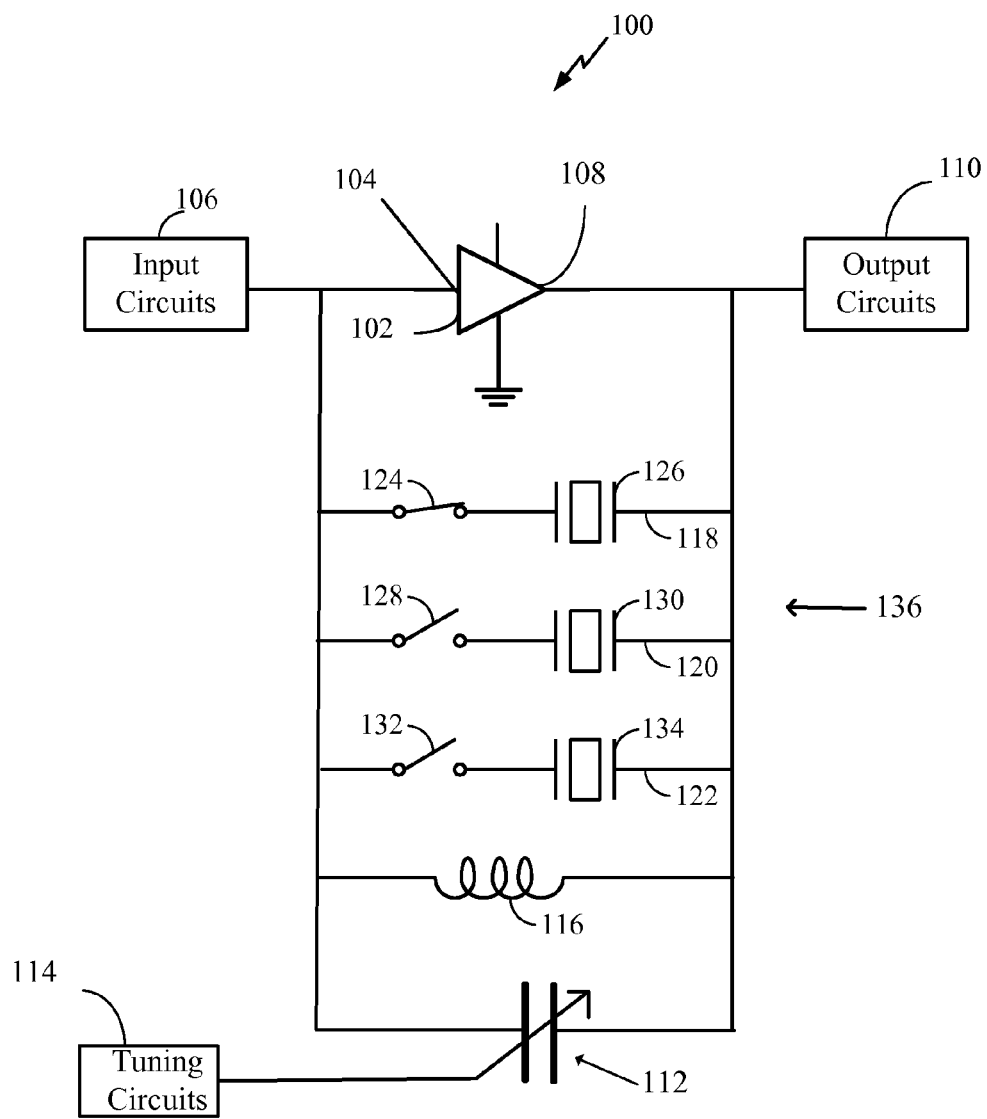
FIG. 1 is a schematic circuit diagram illustrating a multiple frequency reconfigurable voltage controlled oscillator (VCO) according to an embodiment.

Referring now to the figures, FIG. 1 illustrates a circuit 100 that includes an amplifier 102 having an input 104 connected to input circuits 106 and an output 108 connected to output circuits 110. A varactor 112 is connected across the input 104 and the output 108 of the amplifier 102, and is also connected to suitable tuning circuits 114 to vary the output of the amplifier 102. An inductor 116 is also connected across the input 104 and the output 108 of the amplifier 102 in parallel with the varactor 112. In addition, a plurality of circuit paths are connected in parallel with the varactor 112 and the inductor 116 including a first circuit path 118, a second circuit path 120 and a third circuit path 122. The first circuit path 118 includes a first switch 124 in series with a first resonator 126, the second circuit path 120 includes a second switch 128 in series with a second resonator 130, and the third circuit path 122 includes a third switch 132 in series with a third resonator 134. While three circuit paths are illustrated, more or fewer circuit paths and associated resonators and switches can be provided based on the number and/or widths of the frequency bands to be covered.

Figure 2:
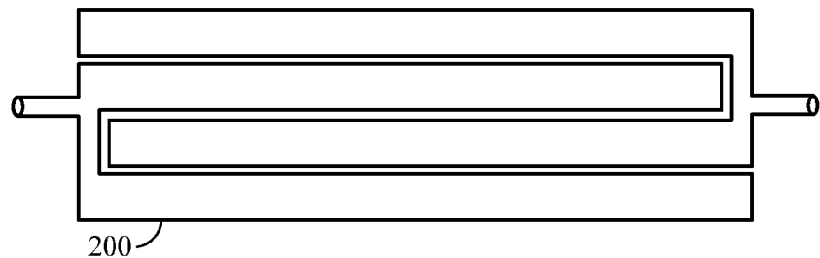
FIG. 2 is a plan view of a first resonator at a first frequency suitable for use in the VCO of FIG. 1.
Figure 3:
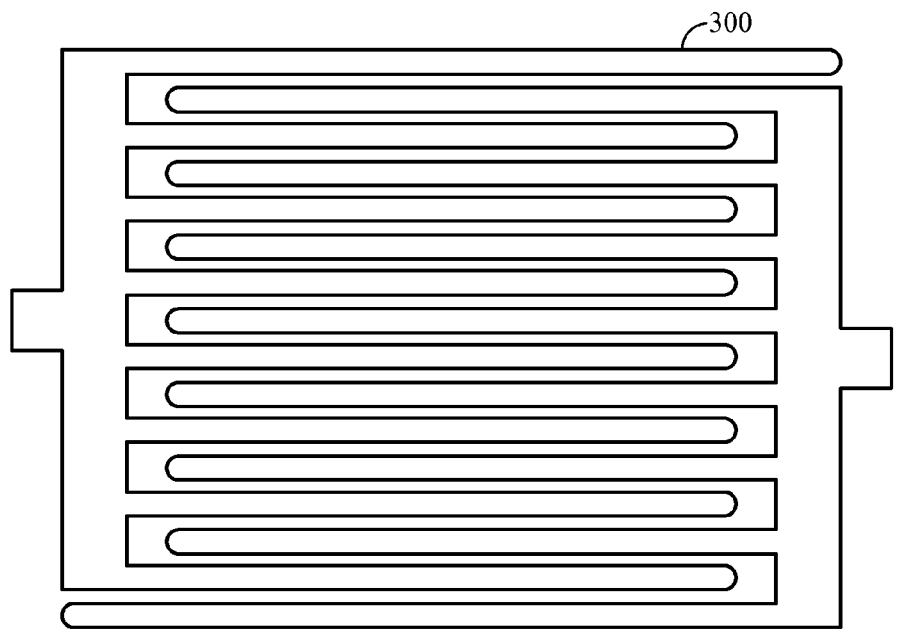
FIG. 3 is a plan view of a second resonator at a second frequency suitable for use in the VCO of FIG. 1.

The first, second and third resonators 126, 130, 134, may comprise piezoelectric laterally vibrating resonators. For example, the first resonator 126 may comprise a resonator like resonator 200 in FIG. 2, configured to resonate at a first frequency, and the third resonator 134 may comprises a resonator like resonator 300 in FIG. 3, configured to resonate at a second frequency, different than the first frequency. The first, second and third switches 124, 128, 132, are independently operable and may comprise RF MEMS switches or conventional MOSFET switches, depending on performance requirements for a given circuit. A suitable controller (not illustrated) controls the open and closed positions of the first, second and third switches 124, 128, 132 to determine which one of the first, second and third resonators 126, 130, 134 is coupled in parallel with the varactor 112 and the inductor 116 and thus determine the center frequency of the VCO 136 formed by the amplifier 102, first through third resonators 126, 130, 134, the inductor 116 and the varactor 112. Beneficially, the presence of the inductor 116 in parallel with any one of the first, second or third piezoelectric laterally vibrating resonators 126, 130, 134 provides a larger effective coupling ($k_t^2$) than is produced without the inductor 116. This provides a larger tuning range for the selected one of the first, second and third resonators 126, 130, 134, a range of about 10 percent to 30 percent, for example, of the center frequency of the selected resonator. In this manner, the benefit of the higher Q-factor of laterally vibrating piezoelectric resonators can be utilized to reduce phase noise, while the inductor 116 is used to increase the effective coupling so as to increase the VCO tuning range to a level that was not generally obtainable using conventional lateral mode piezoelectric resonators.

By properly selecting the center frequencies of the resonators, the VCO 136 can be used to select one or more signal bands of interest. For example, the GSM signal band covers 824-960 MHz and 1710-1910 MHz. To cover this band, the first resonator 126 is selected to have a center frequency of 900 MHz and is tuned by about 15% in either direction to cover the first portion of the GSM band, and the second resonator 130 is selected to have a center frequency of 1800 MHz and is tuned by about 15% in either direction to cover the second portion of the GSM band. A single reconfigurable VCO with two resonators plus inductors and varactors should be able to cover all the GSM bands. If more wireless standards need to be covered, more resonators can be added.

The first, second and third piezoelectric laterally vibrating resonators 126, 130, 134, can be made from various materials including, but not limited to, aluminum nitride (AlN), zinc oxide (ZnO) and lead zirconate titanate (PZT) and may be formed on substrates including silicon, glass, piezoelectric materials, or other composites suitable for realizing single-chip multi-frequency operation. The inductor 116 may be a conventional on-chip inductor and be formed on various substrates such as silicon, silicon on insulator, silicon on glass or be formed as a discrete component. The inductor 116 may alternately comprise an active inductor realized from circuit techniques.

Figure 4:
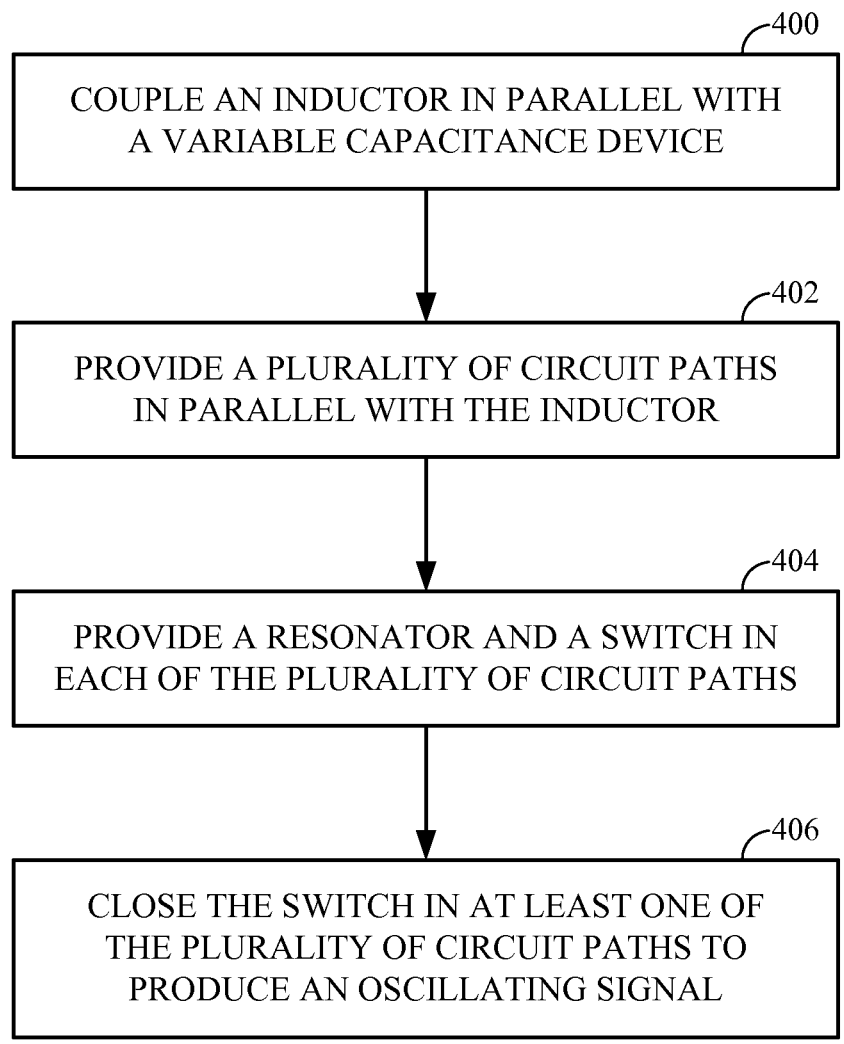
FIG. 4 is a flow chart illustrating a method according to an embodiment.

A method according to an embodiment is illustrated in FIG. 4 and includes a block 400 of coupling an inductor in parallel with a variable capacitance device, a block 402 of providing a plurality of circuit paths in parallel with the inductor, a block 404 of providing a resonator and a switch in each of the plurality of circuit paths, and a block 406 of closing the switch in at least one of the plurality of circuit paths to produce an oscillating signal.

Those of skill in the art will appreciate that the VCO 136 can be used in many environments and in some cases will be integrated into one or more semiconductor dies. Moreover, the VCO 136 and/or a semiconductor die into which it is integrated may be incorporated into a variety of devices including, without limitation, a set top box, a music player, a video player, an entertainment unit, a navigation device, a communications device, a personal digital assistant (PDA), a fixed location data unit, and a computer.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The methods, sequences and/or algorithms described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor.

While the foregoing disclosure shows illustrative embodiments of the invention, it should be noted that various changes and modifications could be made herein without departing from the scope of the invention as defined by the appended claims. The functions, steps and/or actions of the method claims in accordance with the embodiments of the invention described herein need not be performed in any particular order. Furthermore, although elements of the invention may be described or claimed in the singular, the plural is contemplated unless limitation to the singular is explicitly stated.

What is claimed is:

1. A multiple frequency reconfigurable voltage controlled oscillator (VCO) comprising:
    at least one resonator, wherein the at least one resonator is a piezoelectric laterally vibrating contour mode micro-electro-mechanical systems (MEMS) resonator, the at least one resonator comprising a first resonator and a second resonator, wherein the first resonator in the at least one resonator is tunable by about fifteen percent in either direction, and wherein the second resonator in the at least one resonator includes a Q-factor that is greater than about one thousand;
    at least one inductor arranged in parallel with the at least one resonator; and
    a variable capacitance device coupled in parallel to the at least one inductor and arranged in parallel to the at least one resonator, wherein the at least one resonator is selectably coupled in parallel with the at least one inductor and the variable capacitance device.

2. The multiple frequency reconfigurable VCO of claim 1, wherein the at least one resonator comprises a plurality of resonators, and wherein at least one of the plurality of resonators is selectably coupled in parallel with the at least one inductor and the variable capacitance device.

3. The multiple frequency reconfigurable VCO of claim 2, further comprising a plurality of switches, wherein one of the plurality of switches is arranged in series with each of the plurality of resonators.

4. The multiple frequency reconfigurable VCO of claim 1, wherein the at least one resonator comprises a material selected from a group comprising: aluminum nitride (AlN), zinc oxide (ZnO) and lead zirconate titanate (PZT).

5. The multiple frequency reconfigurable VCO of claim 1, wherein the at least one resonator comprises a silicon substrate.

6. The multiple frequency reconfigurable VCO of claim 1, wherein the at least one resonator comprises a piezoelectric substrate.

7. The multiple frequency reconfigurable VCO of claim 1, wherein the variable capacitance device comprises a varactor.

8. The multiple frequency reconfigurable VCO of claim 1, wherein the at least one resonator comprises a plurality of resonators,
    wherein the variable capacitance device comprises a varactor,
    wherein at least one of the plurality of resonators is selectably coupled in parallel with the at least one inductor and the varactor, and
    wherein each of the plurality of resonators comprises a piezoelectric laterally vibrating resonator, and further including a plurality of switches, wherein one of the plurality of switches is arranged in series with each of the plurality of piezoelectric laterally vibrating resonators.

9. The multiple frequency reconfigurable VCO of claim 1 incorporated into at least one semiconductor die.

10. The multiple frequency reconfigurable VCO of claim 1 incorporated into a device selected from a group comprising: a set top box, a music player, a video player, an entertainment unit, a navigation device, a communications device, a personal digital assistant (PDA), a fixed location data unit, and a computer.

11. A method of providing a multiple frequency reconfigurable voltage controlled oscillator (VCO) comprising:
    coupling an inductor in parallel with a variable capacitance device;
    providing a plurality of circuit paths in parallel with the inductor;
    providing at least one resonator and a switch in each of the plurality of circuit paths, wherein the at least one resonator is a piezoelectric laterally vibrating contour mode micro-electro-mechanical systems (MEMS) resonator, the at least one resonator comprising a first resonator and a second resonator, wherein the first resonator in the at least one resonator is tunable by about fifteen percent in either direction, and wherein the second resonator in the at least one resonator includes a Q-factor that is greater than about one thousand; and
    closing the switch in at least one of the plurality of circuit paths to produce an oscillating signal.

12. The method of claim 11, further comprising opening the switch in the at least one of the plurality of circuit paths and closing the switch in another one of the plurality of circuit paths to change a frequency of the oscillating signal.

13. The method of claim 11, wherein the variable capacitance device comprises a varactor.

14. The method of claim 11, further comprising incorporating the VCO into at least one semiconductor die.

15. The method of claim 11, further comprising incorporating the VCO into a device selected from a group comprising: a set top box, a music player, a video player, an entertainment unit, a navigation device, a communications device, a personal digital assistant (PDA), a fixed location data unit, and a computer.

16. A multiple frequency reconfigurable voltage controlled oscillator (VCO) comprising:
    a variable capacitance device;
    an inductor coupled in parallel with the variable capacitance device; and
    at least two circuit paths coupled in parallel with the variable capacitance device and the inductor, the at least two circuit paths each comprising a resonator and a switch for selectably coupling the resonator in parallel with the inductor and the variable capacitance device, wherein the resonator is a piezoelectric laterally vibrating contour mode micro-electro-mechanical systems (MEMS) resonator, wherein the resonator in one of the at least two circuit paths is tunable by about fifteen percent in either direction, and wherein the resonator in another one of the at least two circuit paths includes a Q-factor that is greater than about one thousand.

17. The multiple frequency reconfigurable VCO of claim 16, wherein the variable capacitance device comprises a varactor.

18. The multiple frequency reconfigurable VCO of claim 16, wherein the switch in a first one of the at least two circuit paths is operable independently of the switch in a second one of the at least two circuit paths.

19. A multiple frequency reconfigurable voltage controlled oscillator (VCO) comprising:
   resonator means, wherein the resonator means includes a piezoelectric laterally vibrating contour mode micro-electro-mechanical systems (MEMS) resonator means, the resonator means comprising a first resonator and a second resonator, wherein the first resonator in the at least one resonator is tunable by about fifteen percent in either direction, and wherein the second resonator in the at least one resonator includes a Q-factor that is greater than about one thousand;
   inductor means arranged in parallel with the resonator means;
   variable capacitance means coupled in parallel to the inductor means and arranged in parallel to the resonator means; and
   switch means for selectably coupling the resonator means in parallel with the inductor means.

20. The multiple frequency reconfigurable VCO of claim 19, wherein the resonator means comprises a plurality of resonators, and wherein the switch means is configured to selectably couple at least one of the plurality of resonators in parallel with the inductor means and variable capacitance means.

21. The multiple frequency reconfigurable VCO of claim 20, wherein the switch means comprises a plurality of switches, and wherein one of the plurality of switches is arranged in series with each of the plurality of resonators.

22. The multiple frequency reconfigurable VCO of claim 19, wherein the resonator comprises a material selected from a group comprising: aluminum nitride (AlN), zinc oxide (ZnO) and lead zirconate titanate (PZT).

23. The multiple frequency reconfigurable VCO of claim 19, wherein the variable capacitance means comprises a varactor.

24. The multiple frequency reconfigurable VCO of claim 19,
   wherein the resonator means comprises a plurality of resonators,
   wherein the variable capacitance means comprises a varactor,
   wherein at least one of the plurality of resonators is selectably coupled in parallel with the inductor means and the varactor,
   wherein each of the plurality of resonators comprises a piezoelectric laterally vibrating resonator, and
   wherein the switch means comprises a plurality of switches, one of the plurality of switches being arranged in series with each of the plurality of resonators.

25. The multiple frequency reconfigurable VCO of claim 19 incorporated into at least one semiconductor die.

26. The multiple frequency reconfigurable VCO of claim 19 incorporated into a device selected from a group comprising: a set top box, a music player, a video player, an entertainment unit, a navigation device, a communications device, a personal digital assistant (PDA), a fixed location data unit, and a computer.

27. A method of providing a multiple frequency reconfigurable voltage controlled oscillator (VCO) comprising:
   a step for coupling an inductor in parallel with a variable capacitance device;
   a step for providing a plurality of circuit paths in parallel with the inductor;
   a step for providing a resonator and a switch in each of the plurality of circuit paths, wherein the resonator comprises a piezoelectric laterally vibrating contour mode micro-electro-mechanical systems (MEMS) resonator, wherein the resonator in one of the circuit paths is tunable by about fifteen percent in either direction, and wherein the resonator in another one of the circuit paths includes a Q-factor that is greater than about one thousand; and
   a step for closing the switch in at least one of the plurality of circuit paths to produce an oscillating signal.

28. The method of claim 27, further comprising step for opening the switch in the at least one of the plurality of circuit paths and step for closing the switch in another one of the plurality of circuit paths to change the frequency of the oscillating signal.

29. The method of claim 27, wherein the resonator in each one of the plurality of circuit paths comprises a piezoelectric laterally vibrating resonator.

30. The method of claim 27, wherein the variable capacitance device comprises a varactor.

31. The method of claim 27, further comprising step for incorporating the VCO into at least one semiconductor die.

32. The method of claim 27, further comprising step for incorporating the VCO into a device selected from a group comprising: a set top box, a music player, a video player, an entertainment unit, a navigation device, a communications device, a personal digital assistant (PDA), a fixed location data unit, and a computer.

* * * * *